United States Patent
Zhao et al.

(10) Patent No.: US 8,537,046 B2
(45) Date of Patent: Sep. 17, 2013

(54) SYSTEM AND METHOD FOR ANALOG TO DIGITAL (A/D) CONVERSION

(75) Inventors: Jian Hua Zhao, Shanghai (CN); Yuxing Zhang, Jiangsu (CN)

(73) Assignee: STMicroelectronics R & D (Shanghai) Co., Ltd., Shanghai (CN)

( * ) Notice: Subject to any disclaimer, the term of this patent is extended or adjusted under 35 U.S.C. 154(b) by 0 days.

(21) Appl. No.: 13/331,611

(22) Filed: Dec. 20, 2011

(65) Prior Publication Data

US 2012/0326901 A1 Dec. 27, 2012

(30) Foreign Application Priority Data

Dec. 20, 2010 (CN) .......................... 2010 1 0612304

(51) Int. Cl.
*H03M 1/12* (2006.01)

(52) U.S. Cl.
USPC ............................ 341/172; 341/118; 341/155

(58) Field of Classification Search
USPC ......................................................... 341/172
See application file for complete search history.

(56) References Cited

U.S. PATENT DOCUMENTS

| | | | | |
|---|---|---|---|---|
| 4,851,846 A * | 7/1989 | Haulin | ............................ | 341/172 |
| 5,684,487 A | 11/1997 | Timko | | |
| 6,879,277 B1 | 4/2005 | Cai | | |
| 7,339,512 B2 * | 3/2008 | Gulati et al. | ................... | 341/172 |
| 7,834,796 B2 * | 11/2010 | Xu et al. | ........................ | 341/172 |
| 2008/0068245 A1 | 3/2008 | Kuramochi et al. | | |

* cited by examiner

*Primary Examiner* — Khai M Nguyen
(74) *Attorney, Agent, or Firm* — Slater & Matsil, L.L.P.

(57) ABSTRACT

In one embodiment, a method for converting an analog input value to a digital output value is disclosed. A successive approximation is performed. The analog input is quantized to a first quantized value, which is converted to a first analog value using a DAC. The first analog value is subtracted from the analog input value to form a first residue. The first residue is quantized to form a second quantized value, and a second residue is formed by converting the second quantized value to a second analog value using the DAC and subtracting the second analog value from the first residue value. The second residue is then quantized to form a third quantized value. The first, second and third quantized values are converted into a digital output value. The first, second and third quantized values each have at least three levels.

23 Claims, 9 Drawing Sheets

SYSTEM AND METHOD FOR ANALOG TO DIGITAL (A/D) CONVERSION

CROSS-REFERENCE TO RELATED APPLICATIONS

This application claims the priority benefit of Chinese patent application number 201010612304.5, filed on Dec. 20, 2010, which is hereby incorporated by reference in its entirety.

TECHNICAL FIELD

This invention relates generally to electronic circuits, and more particularly to a system and method for analog to digital (A/D) conversion.

BACKGROUND

Analog to digital (A/D) converters, which are used to convert analog signals into digital form, are used in numerous electronic applications such as audio and video recording, telecommunications systems and sensing systems. Depending on the particular application and its corresponding specifications, such as sampling rate, resolution and linearity, different A/D architectures are suitable for various applications. For example, low power medium resolution A/Ds are used for applications such as ultrasound and analog front ends for digital cameras.

In moderate sampling rate applications with medium resolution requirements, for example, sampling rates between 10kΩ and 10MΩ, and bit resolutions of between 8 bits and 11 bits, successive approximation A/D converters are pervasive. A successive approximation A/D, as shown in FIG. 1, has comparator 106, successive approximation register and control logic 104, DAC 102 and summing circuit 108. To perform a conversion, DAC 102 is set to half of full-scale with a code, for example, of 10000000 (binary). Comparator 106 compares the difference between the output of DAC 102 and input voltage $V_1$ to determine the most significant bit (MSB) of the digital output word. If the output of DAC 102 is greater than Vi, the DAC is set to one-quarter scale (i.e., 01000000) during a next comparison cycle. If, on the other hand, the output of DAC 102 is less than Vi, the DAC is set to three-quarter scale (i.e., 11000000) during the next conversion. During the next conversion, the difference between the output of DAC 102 input voltage $V_i$ is again compared to determine the next DAC value. The output of DAC 102 gradually approximates input voltage $V_i$ more and more during each successive cycle. After eight comparison cycles, a digital output code is determined based on the input to DAC 102.

FIG. 2 illustrates a conventional switched capacitor implementation 200 of a successive approximation A/D. The switched capacitor successive approximation A/D converter has comparator 204, and register and switch control logic 202. The DAC is implemented with binary weighted capacitor array 210 and switches 208. Capacitor array 210 is also used as a sampling capacitor. During a first phase of operation, input $V_i$ is coupled to the bottom plates of capacitor array 210 via switches 208, and the top plates of capacitor array 210 is coupled to ground via switch 206. Switch 206 is then opened, the bottom plates of capacitor array 210 remain coupled to Vi, and a first comparison is made. The bottom plate of capacitor group 210 is then coupled to Vref+ or Vref– depending on the result of the previous comparison. After each conversion cycle, each successive capacitor group is successively coupled to Vref+ or Vref– until the binary search is complete and an output code is derived. Because charge is conserved in capacitor array 210, errors do not accumulate after each conversion cycle. For high resolutions, however, A/D linearity and accuracy can be compromised because if comparator 204 is slow or inaccurate. Practical implementations of a switched capacitor successive approximation A/D converter 200, may, therefore use very high power comparators.

SUMMARY

In one embodiment, a circuit for performing an analog to digital (A/D) conversion is disclosed. The circuit has an amplifier, a capacitor array having capacitors, and an A/D converter coupled to the output of the amplifier. Respective first ends of a plurality of the capacitors are each coupled to a selection circuit configured to individually couple the respective first end of each of the plurality of capacitors to a system input voltage, the output of the amplifier, or one of a plurality of reference voltages. The second ends of each of the plurality of capacitors are coupled to the input of the amplifier. The circuit also has a control unit configured to sample the system input voltage by controlling the selection circuit to couple the first end of each capacitor in the capacitor array to the system input voltage in a sampling step. After the sampling step, the control unit causes the circuit A/D converter to perform a first A/D conversion in a first conversion step to produce a first conversion result. After the first conversion step, the control unit causes the circuit to selectively couple a respective first end of each of a first group of the plurality of capacitors to one of the plurality of reference voltages based on the first conversion result. The control unit also causes the circuit to couple a respective first end of the plurality of capacitors not in the first group to the output of the amplifier by controlling the selection circuit. The control circuit then causes the second A/D converter to perform a second A/D conversion to produce a second conversion result. The circuit also has an output circuit that performs a weighted sum of the first and second conversion results to produce a system output value.

In another embodiment, a semiconductor circuit for performing an A/D conversion is disclosed. The circuit has an amplifier and a capacitor array having capacitors. A respective first end of a plurality of the capacitors is each coupled to a selection circuit configured to individually couple the first end of each of the plurality of capacitors to a system input voltage, the output of the amplifier, or one of a plurality of reference voltages. The second end of each of the plurality of capacitors are coupled to the input of the amplifier. A first A/D converter is coupled to the system input, and a second A/D converter is coupled to the output of the amplifier. The circuit further has a control unit configured to control the circuit to perform a first A/D conversion using the first A/D converter to produce a first conversion result, sample the system input voltage by controlling the selection circuit to couple the first end of each capacitor in the capacitor array to the system input voltage in a sampling step, and, after the sampling step, selectively couple a respective first end of each of a first group of the plurality of capacitors to one of the plurality of reference voltages based on the first conversion result, and couple a respective first end of each the plurality of capacitors not in the first group to the output of the amplifier by controlling the selection circuit in a first redistribution step. The control unit is further configured to, after the first redistribution step, cause the second A/D converter to perform a second A/D conversion in a second conversion step to produce a second conversion result. After the second conversion step, the control unit causes the selection circuit to selectively couple a respective first end of each of a second group of the plurality of capacitors to one of the plurality of reference voltages based on the second conversion result. Respective first ends of the plurality of capacitors not in the first group or in the second group are coupled to the output of the amplifier in a second redistribution step. After the second redistribution step, the control unit causes the second A/D converter to perform a third A/D conversion in a third conversion step to produce a third conversion result. The semiconductor circuit also has an output circuit configured to perform a weighted sum of the first, second and third conversion results to produce a system output value.

In a further embodiment, a method for converting an analog input value to a digital output value is disclosed, in which a successive approximation is performed. The analog input is quantized to a first quantized value having one of at least three levels. The first quantized value is converted to a first analog value using a DAC, and the first analog value is subtracted from the analog input value to form a first residue. The first residue is quantized to form a second quantized value having one of at least three levels. A second residue is formed by converting the second quantized value to a second analog value using the DAC, and subtracting the second analog value from the first residue value. The second residue is quantized to form a third quantized value having one of at least three levels. The first, second and third quantized values are converted into a digital output value.

The foregoing has outlined, rather broadly, features of the present disclosure. Additional features of the disclosure will be described, hereinafter, which form the subject of the claims of the invention. It should be appreciated by those skilled in the art that the conception and specific embodiment disclosed may be readily utilized as a basis for modifying or designing other structures or processes for carrying out the same puREFNoses of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in different figures generally refer to corresponding parts unless otherwise indicated. The figures are drawn to clearly illustrate the relevant aspects of embodiments of the present disclosure and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of embodiments are discussed in detail below. It should be appreciated, however, that the present invention provides many applicable inventive concepts that may be embodied in a wide variety of specific contexts. The specific embodiments discussed are merely illustrative of specific ways to make and use the invention, and do not limit the scope of the invention.

The present invention will be described with respect to embodiments in a specific context, namely a system and method for analog to digital conversion using a charge redistribution successive approximation A/D. Embodiments of this invention may also be applied to other circuits and systems that perform analog-to digital conversions.

Figure 1:
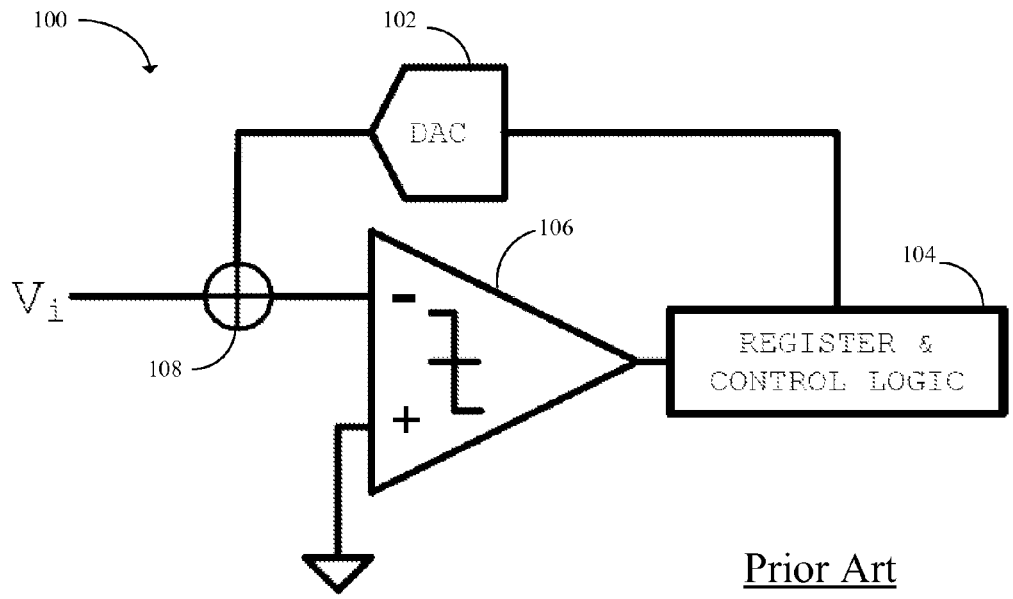
FIG. 1 illustrates a schematic of a prior art successive approximation A/D converter.
Figure 2:
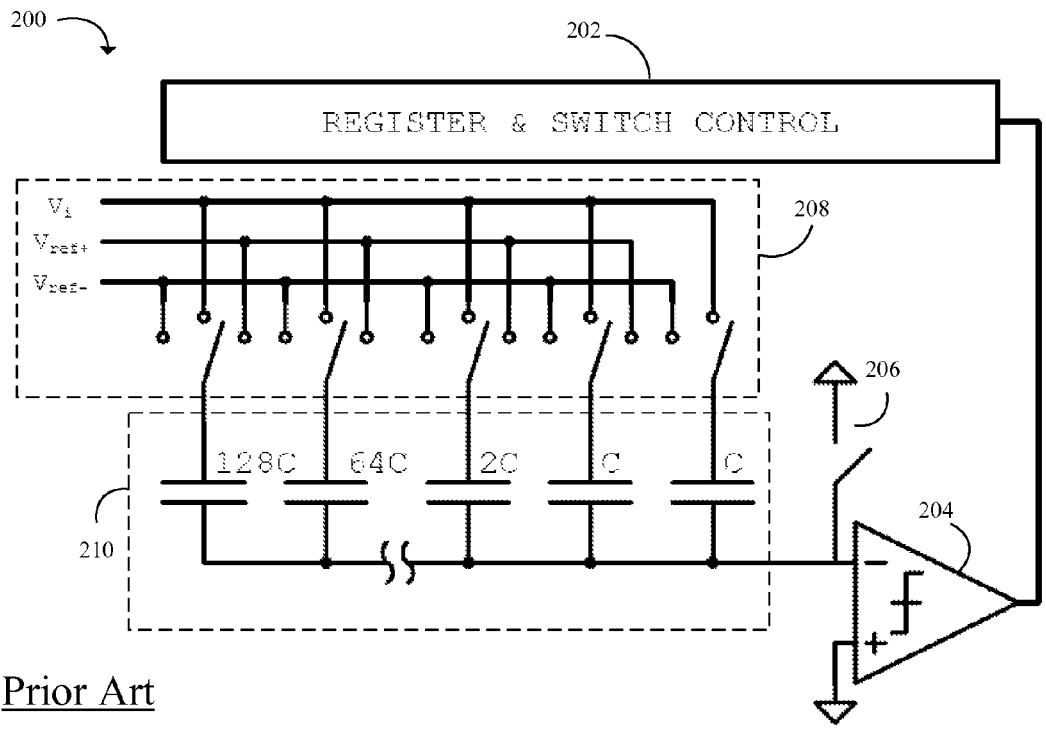
FIG. 2 illustrates a schematic of an embodiment A/D converter.
Figure 3A:
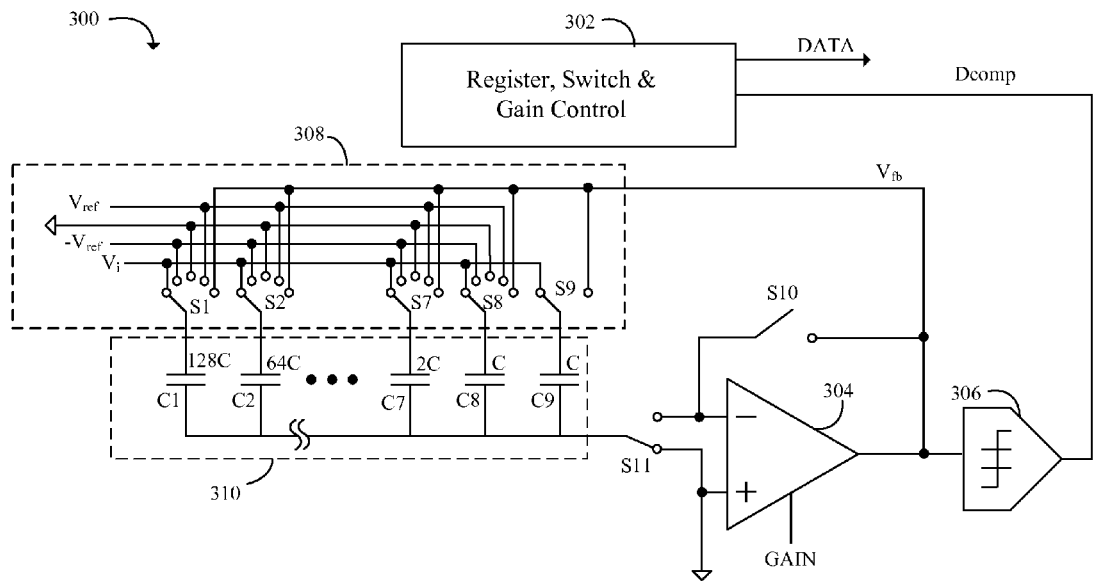
FIGS. 3a-3d illustrate schematics showing the operation of an embodiment A/D converter.

FIG. 3a illustrates A/D 300 converter according to an embodiment. A/D converter 300 has switch array 308, capacitor array 310, amplifier 304, sub-A/D 306 and logic block 302 that has control logic for switch array 308, amplifier switches S10 and S11, and gain control input GAIN to amplifier 304. A/D 300 is an 8-bit analog to digital converter that converts input voltage Vi to 8-bit digital output word DATA. In an embodiment, capacitor array has 256 unit capacitors (or an equivalent) including C1, which has 128 unit capacitors, C2, which has 64 unit capacitors, C7, which has 2 unit capacitors and C8 and C9, which each has one unit capacitor. Capacitors C3, C4, C5 and C6 that have 32, 16, 8 and 4 unit capacitors, respectively, are not shown for simplicity of illustration. Capacitors C1-C9 are implemented using unit capacitors having a top plate and a bottom plate. The top plate is coupled to amplifier 304 via switch S11. In alternative embodiments, however, capacitors C1-C9 can be implemented without using unit capacitors, for example, to conserve silicon area.

Switch array 308 is configured to independently couple capacitors C1-C8 to input voltage $V_i$, reference voltages $-V_{ref}$, ground and $V_{ref}$, or feedback voltage Vfb from the output of amplifier 304. Switch S9 within switch array 308 couples the bottom plate of capacitor C9 to either input voltage $V_i$ or feedback voltage Vfb. Switch S11 couples the top plate of capacitor array 310 to the inverting or non-inverting input of amplifier 304, and switch S10 couples the inverting input of amplifier 304 with the output of amplifier 304. Amplifier 304 is provided with gain control input GAIN. In an embodiment, logic block 302 changes the gain of amplifier to 304 during A/D conversion in order to compensate for changes in the loop gain caused by changes in feedback factor when capacitor array 310 is switched. In an embodiment, sub-A/D 306 is a 1.5 A/D converter having three levels. In alternative embodiments, other resolutions can be used for sub-A/D 306.

Figure 3B:
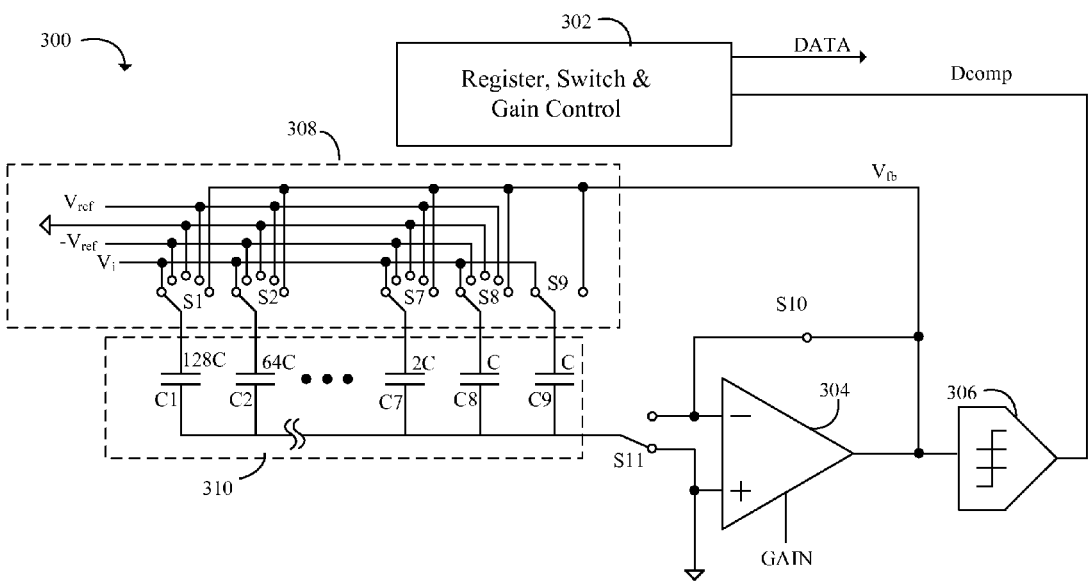

At the beginning of each conversion, the bottom plate of capacitors C1-C9 in capacitor array 310 are coupled to Vi via switch array 308, and the top plate of capacitors C1-C9 are grounded via switch S11, as illustrated in FIG. 3b. Switch S10 is closed, thereby placing amplifier 304 in a unity gain configuration to place the amplifier in a known state during sampling. In alternative embodiments, the top plate of capacitors C1-C9 can be coupled to reference voltages other than ground. When all capacitors in capacitor array 310 are charged to $V_i$, the total charge in capacitor array 310 is $256C*V_i$.

Figure 3C:
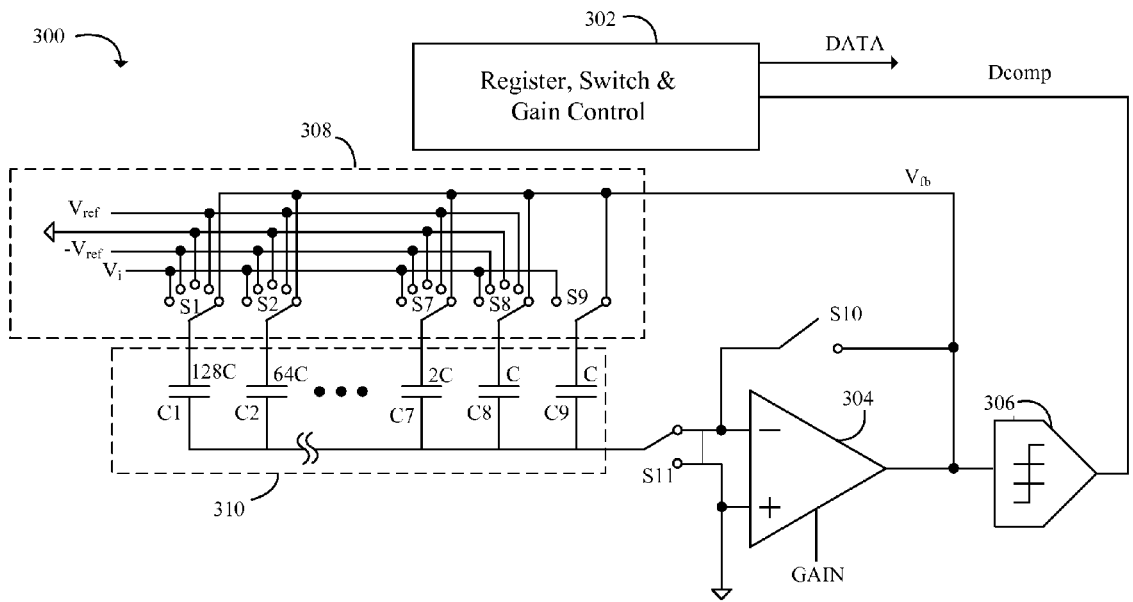

After the sampling step, the bottom plate of all 256 capacitors in capacitor array 310 are coupled to feedback voltage $V_{fb}$ via switch array 308 in a first conversion cycle as shown in FIG. 3c. In an embodiment, output $V_{fb}$ of amplifier 304 is approximately the sampled input voltage $V_i$. Sub-A/D 306 then converts output voltage $V_{fb}$ of amplifier 304 into digital code Dcomp, which is provided as an input to logic block 302.

Figure 3D:
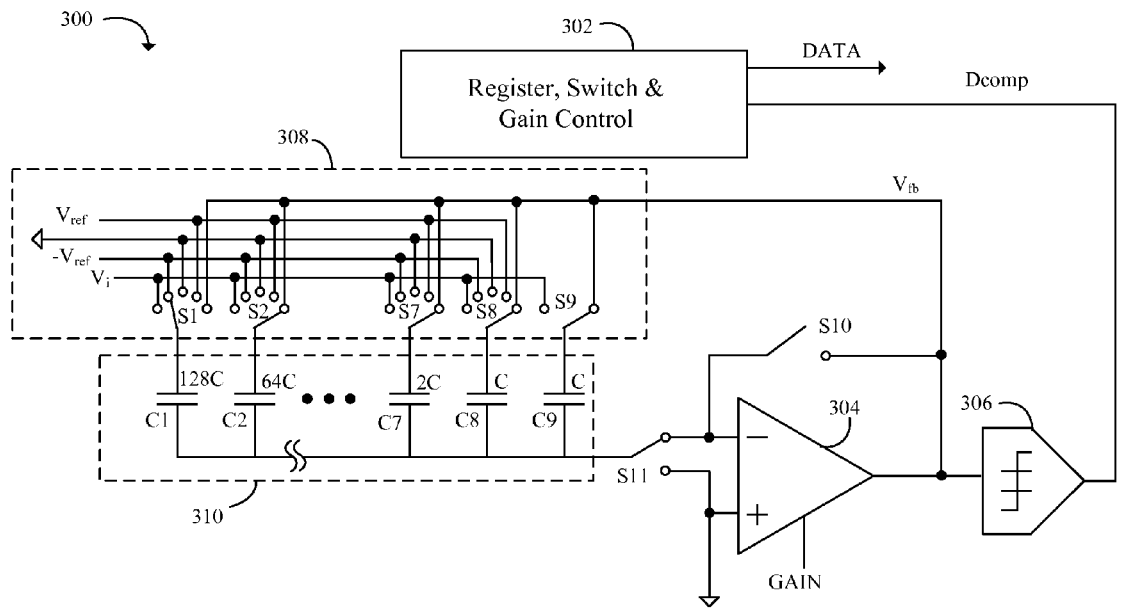

Turning to FIG. 3d, in a second conversion cycle, the bottom plate of capacitor C1 is coupled to one of reference voltages $-V_{ref}$, ground or $V_{ref}$ based on the sub-A/D result of the first conversion cycle. In an embodiment, mapping from sub-A/D 306 to the switch selection for switch S1 is shown in Table 1.

TABLE 1

| Comparator output to C1 bottom plate mapping | |
|---|---|
| Sub-A/D Output | C1 Connection |
| 00 | −Vref |
| 01 | 0 |
| 11 | Vref |

During the second conversion cycle, the total charge on the capacitor array is not changed:

$$Q\text{total} = 256C*Vi.$$

The charge on C1 is:

$$Q1 = 128C*(-Vref).$$

The total charge on remaining capacitor array (C2-C9) is:

$$Q\text{total} - Q1 = 256C*Vi - 128C*(-Vref).$$

The output voltage of amplifier 304 at the end of the second conversion cycle is, therefore:

$$(Q\text{total} - Q1)/128C = (Vi - (-Vref)/2)*2 = (Vi - Vdac)*2.$$

Because capacitor array 310 forms a feedback network with a feedback factor of ½, due to the ratio of C1 to the entire capacitance of array 310, residue voltage (Vi−Vdac) is amplified by a factor of two.

In the next conversion cycle, the sub-A/D converts the residue voltage and the bottom plate of C2 is coupled to one of reference voltages $-V_{ref}$, ground or $V_{ref}$ based on the sub-A/D result of the second conversion cycle according to the mapping shown in Table 1. The bottom plate of capacitors C3-C9 remain coupled to the $V_{fb}$, and subA/D 306 performs another conversion.

The operation is similar in subsequent cycles. The connection of the remaining capacitors is changed one-by-one according to the output of sub-A/D 306. Accordingly, the feedback factor, and hence the closed-loop gain of the amplifier, increases at each successive conversion step. For the nth conversion the output voltage is:

$$Vo = (Vi - Vdac)*2^n.$$

At the last cycle, capacitor C9 is coupled to output $V_{fb}$ of amplifier 304. The output voltage during the last conversion step is, therefore:

$$Vo = (Vi - Vdac)*128.$$

This voltage is converted to digital code by sub-A/D 306 and combined with the previous digital outputs, and a whole digital code is generated for output word DATA. The conversion is finished and a new conversion is started by coupling the bottom plate of capacitor array 310 to $V_i$, as shown in FIG. 3b.

In an embodiment, the gain of amplifier 304 is adjusted to compensate for the change in open loop gain. Without compensation, the closed-loop bandwidth and settling time of amplifier 306 decreases with increased open loop gain. By decreasing the open loop gain of amplifier 304 during each successive conversion cycle, the closed-loop bandwidth and settling time of amplifier 304 can either be made constant, or made to conform to a minimum settling time. For example, during the first conversion cycle, when C1 is coupled to one of the reference voltages and remaining capacitors C2-C9 are coupled to amplifier 304 output $V_{fb}$, amplifier 304 is set to maximum gain. At the second conversion cycle, when capacitors C1 and C2 are coupled to one of the reference voltages and remaining capacitors C3-C9 are coupled to amplifier 304 output $V_{fb}$, amplifier 304 is set to ½ gain so that at constant closed loop bandwidth is maintained. In successive conversion steps, the gain of amplifier 304 is reduced by a factor of two at each step. In alternative embodiments of the present invention, the gain of amplifier 304 can be reduced more or less than a factor of two depending on the embodiment and its specifications. In further embodiments, the gain of amplifier 304 may not be reduced at every conversion cycle. For example, the gain can remain constant during early cycles if the settling time is sufficient, then reduced at later cycles to prevent the settling time from violating a minimum settling time criterion.

Figure 4:
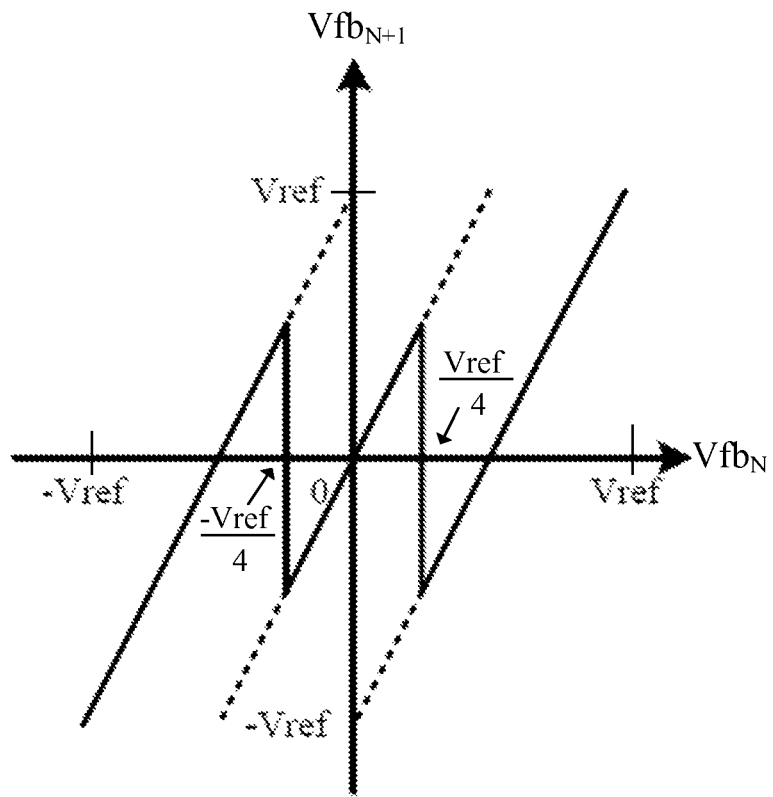
FIG. 4 illustrates a transfer function of an embodiment sub-A/D converter.

In an embodiment of the present invention, a redundancy algorithm is used. Sub-A/D 306 utilizes a 1.5 bit A/D having two comparators that compare the output of amplifier 304 with Vref/4 and −Vref/4 respectively. The mapping is shown in FIG. 4. The horizontal axis represents the input to the 1.5 bit A/D at the Nth conversion cycle, and the vertical axis represents the resulting residue at the (N+1)th conversion cycle. The dotted lines represent mapping due to errors. It is shown that as long as the total error is less than Vref/4, the output voltage of next cycle is still within the full scale of sub-A/D 306 even with a wrong digital code. This comparison error is then corrected in following cycles because a correctable residue error in a first conversion will cause an opposite error in successive conversions, so that the effect of the sum of correctable errors on the output code approaches zero after a number of conversion cycles. A comparison error, therefore, is compensated. Because an error correction is used, a less accurate comparator that uses less power and has a larger offset, such as a dynamic latch, can be used in A/D 300.

In embodiments, charge held on capacitor array 310 is constant during the conversion. Even if the amplifier output has an error voltage caused, for example, by noise, settling error, or other disturbance in a conversion cycle, in the next cycle the output voltage is still determined by the total charge and the connection of capacitor array 310. Errors do not accumulate from cycle to cycle in embodiments. The requirement for the noise and settling error is, therefore, determined by the resolution and performance of the sub-ADC but not the resolution of the whole ADC. Settling error and noise can, therefore, be well tolerated.

Figure 5:
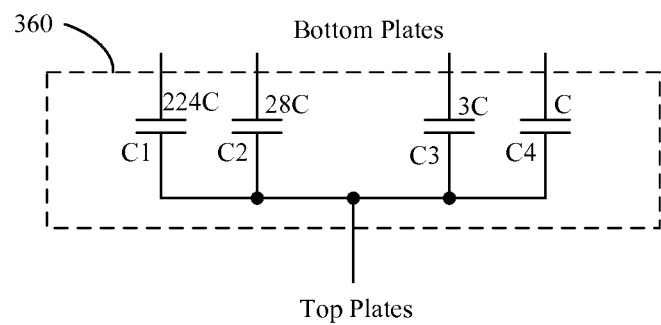
FIG. 5 illustrates an alternative embodiment capacitor array.

In an alternative embodiment, sub-A/D 306 can have a resolution higher than 1.5 bits. For example, if a 3.5-bit sub-A/D is used, 224C instead of 128C will change connection after the first conversion cycle. Capacitor array 360 used with an embodiment 3.5-bit sub A/D is illustrated in FIG. 5. Capacitor array 360 has a first capacitor C1=224C, a second capacitor C2=28C, a third capacitor C3=3C and a fourth capacitor C4=C. In general, the amount of capacitance that changes on the first cycle for a N bit sub-A/D is:

$$C_{S1} = (1 - 2^{floor(N)})C_{TOT},$$

where $C_{TOT}$ is the total capacitance of the capacitor array and floor(N) is the first integer less than or equal to N. The capacitance switched at the next conversion is then:

$$C_{S2} = (1 - 2^{floor(N)})(C_{TOT} - C_{S1}).$$

Generally, for the Qth, conversion cycle, the next switched capacitance, $C_Q$ is:

$$C_Q = (1 - 2^{floor(N_Q)})\left(C_{TOT} - \sum_{p=0}^{Q-1} C_p\right), C_0 = 0,$$

where $N_Q$ is the resolution of the sub-A/D during the Qth conversion cycle. In alternative embodiments, other relationships for $C_Q$ can be used.

In an alternative embodiment, error correction and redundancy is achieved by using a lower closed-loop gain for the network formed by amplifier 304 and capacitor array 310 by switching 96C instead of 128C after the first cycle. After the first cycle, the residue is (Vi−Vdac)*1.6. Alternatively, other capacitance values less than 128C can be switched after the first conversion.

In an alternative embodiment, the first several conversion cycles are accomplished without using an amplifier by coupling the sub-A/D directly to capacitor array 310. After several cycles when the residue (Vi−Vdac) gets smaller, capacitor array 310 is coupled to amplifier 304, which is used to amplify the residue voltage thereafter.

Figure 6:
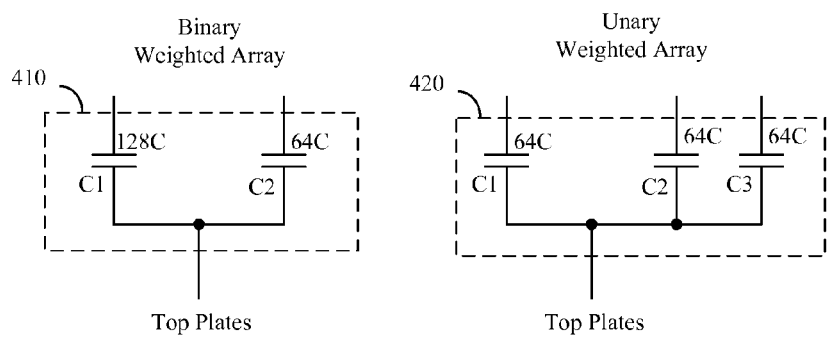
FIG. 6 illustrates a further alternative embodiment capacitor array.

In an alternative embodiment, a unary weighted capacitor array is used instead of binary weighted capacitor array 420. FIG. 6 illustrates a portion 410 of a binary weighted capacitor array used for the first two conversion cycles, and a portion 420 of a unary weighted array used for the first two conversion cycles of can be used as shown in FIG. 6. Table 2 illustrates a comparative mapping between binary weighed capacitor array 410 and the unary weighted capacitor array 420 for the first two conversion cycles.

Figure 7:
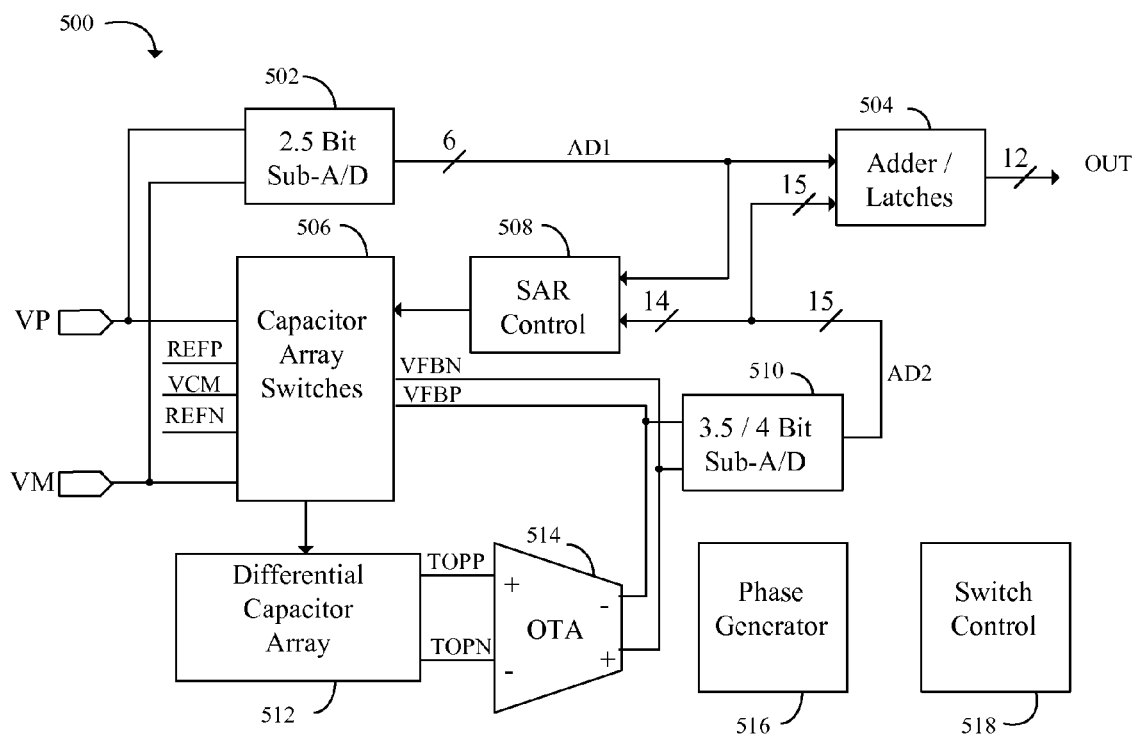
FIG. 7 illustrates a block diagram of a further embodiment A/D converter.

FIG. 7 illustrates A/D 500 that converts differential input signal VP and VN to 12 bit digital OUT, according to another embodiment. Capacitor array 512 is implemented as a differential capacitor array, and amplifier 514 is implemented as an operational transconductance amplifier (OTA). A/D 500 uses two sub-A/D converters, namely 2.5-bit sub A/D 502 and sub A/D 510, which operate as either a 3.5-bit sub-A/D or a 4-bit sub-A/D. Capacitor array switches 506 are controlled by successive approximation register (SAR) and control logic 508, as well as by switch control logic 518. Phase generator 516 produces multi-phase clocks used by A/D 500, and adder and latch block 504 accumulates and stores digital output signal OUT.

A/D 500 is fabricated on an integrated circuit using a 250 nm SiGe process and has a differential architecture to enhance the circuit's tolerance to interference and power supply noise. The circuit, which is clocked using a 50 MHz internal clock, has an input voltage range of about one volt peak-to-peak differential. In alternative embodiments, other semiconductor processes, clock frequencies and input voltage ranges can be used.

In an embodiment, to perform a conversion, A/D 500 samples differential input voltage VP-VM on differential capacitor array 512 via capacitor array switches 506. Next, 2.5 bit sub-A/D 502 performs a first A/D conversion on differential input voltage VP-VM, and quantizes the differential input voltage to one seven levels. In an embodiment, this conversion is performed on the sampled signal. Alternatively, the first conversion can be performed on the sampled voltage at the top plates of capacitor array 512, or on differential input voltage VP-VM prior to sampling. After the first A/D conversion, a charge redistribution step is performed on differential capacitor array 512 based on the result of the first conversion and logic within SAR control block 508. Next, 3.5/4-bit A/D converter 510 performs a second A/D conversion on differential output VFBP-VFBN of OTA 514. After the second A/D conversion, a second charge redistribution step is performed on differential capacitor array 512 based on the result of the first and second conversions and logic within SAR control block 508.

3.5/4-bit A/D converter 510 then performs a 3.5 bit third A/D conversion on differential output VFBP-VFBN of OTA 514 followed by a second charge redistribution step performed on differential capacitor array 512 based on the result

TABLE 2

Mapping from Sub-A/D Output to Capacitor Array Connection

| Sub-A/D Output (Cycle 1) | Sub-A/D Output (Cycle 2) | Binary Weighted | | Unrary Weighted | | |
|---|---|---|---|---|---|---|
| | | C1 Connection | C2 Connection | C1 Connection | C2 Connection | C3 Connection |
| 00 | 00 | −Vref | −Vref | −Vref | −Vref | −Vref |
| 00 | 01 | −Vref | 0 | −Vref | −Vref | 0 |
| 00 | 11 | −Vref | Vref | −Vref | 0 | 0 |
| 01 | 00 | 0 | −Vref | −Vref | 0 | 0 |
| 01 | 01 | 0 | 0 | 0 | 0 | 0 |
| 01 | 11 | 0 | Vref | Vref | 0 | 0 |
| 11 | 00 | Vref | −Vref | Vref | 0 | 0 |
| 11 | 01 | Vref | 0 | Vref | Vref | 0 |
| 11 | 11 | Vref | Vref | Vref | Vref | Vref |

In further embodiments, A/D 300 may have higher or lower resolution than 8 bits, in which case capacitor array 310 has the equivalent of at least $2^n$ unit capacitors wherein n is the number of bits.

of the first, second and third conversions. The results of the first, second and third conversions are stored in SAR control block 508 to facilitate the charge redistribution steps. Finally 3.5/4-bit A/D converter 510 then performs a 4-bit fourth A/D conversion on differential output VFBP-VFBN. The results of the first, second, third and fourth conversions are scaled and accumulated by adder/latch block 504 that produces 12-bit output word OUT.

Figure 8:
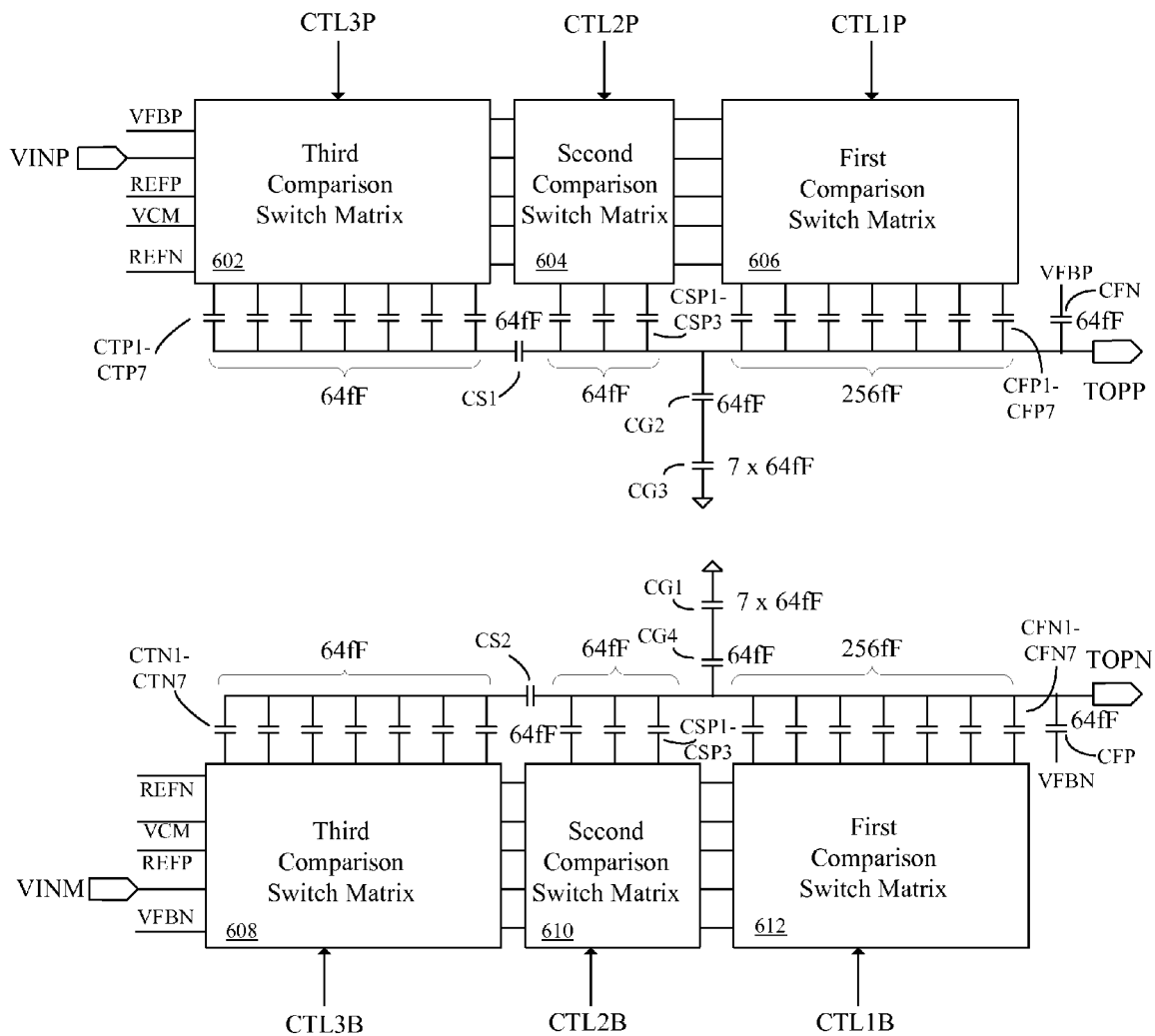
FIG. 8 illustrates a schematic of a further embodiment capacitor array.

FIG. 8 illustrates an embodiment schematic of capacitor array switches coupled to the differential capacitor array. In an embodiment, the differential capacitor array has two sets of symmetric capacitors that each has a nominal total equivalent capacitance of about 2.1 pF. The top plate of the first set of capacitors is coupled to node TOPP, and the top plate of the second set of capacitors is coupled to node TOPN. First, second and third comparison switch matrices 606, 604 and 602 selectively couple the bottom plates of capacitors within the first set of capacitors to reference voltages REFP, REFN or VCM, or to positive input voltage VINP, or to positive amplifier feedback node VFBP. First, second and third comparison switch matrices 608, 610 and 612 selectively couple the bottom plates of capacitors within the first set of capacitors to reference voltages REFP, REFN or VCM, or to negative input voltage VINM, or to negative amplifier feedback node VFBN.

First comparison switch matrices 606 and 612, controlled by signals CTL1P and CTL1B, respectively, initially couple the bottom plates of 256 fF capacitors CFP1-CFP7 and CFN1-CFN7 to VINP and VINM, respectively, during a sampling stage and during the first conversion by a 3.5-bit sub-A/D. After the first conversion, the bottom plates of the seven 256 fF capacitors in the first sub-array are coupled to REFP, VCM or REFN depending on the result of the first conversion by 3.5-bit sub-A/D as described in Table 3. The mapping is performed in SAR control block 508, which also stores conversion results so that the voltages asserted on the bottom plates of the capacitor remain present until the end of all conversion cycles.

TABLE 3

Bottom plate of first capacitor sub-array of the first set of capacitors after the first conversion

| FIRST 3.5 BIT Conversion Result | CFP1 | CFP2 | CFP3 | CFP4 | CFP5 | CFP6 | CFP7 |
|---|---|---|---|---|---|---|---|
| 00000001111111 | REFN | REFN | REFN | REFN | REFN | REFN | REFN |
| 00000001111110 | REFN | REFN | REFN | REFN | REFN | REFN | VCM |
| 00000001111100 | REFN | REFN | REFN | REFN | REFN | VCM | VCM |
| 00000001111000 | REFN | REFN | REFN | REFN | VCM | VCM | VCM |
| 00000001110000 | REFN | REFN | REFN | VCM | VCM | VCM | VCM |
| 00000001100000 | REFN | REFN | VCM | VCM | VCM | VCM | VCM |
| 00000001000000 | REFN | VCM | VCM | VCM | VCM | VCM | VCM |
| 00000000000000 | VCM | VCM | VCM | VCM | VCM | VCM | VCM |
| 00000010000000 | REFP | VCM | VCM | VCM | VCM | VCM | VCM |
| 00000110000000 | REFP | REFP | VCM | VCM | VCM | VCM | VCM |
| 00001110000000 | REFP | REFP | REFP | VCM | VCM | VCM | VCM |
| 00011110000000 | REFP | REFP | REFP | REFP | VCM | VCM | VCM |
| 00111110000000 | REFP | REFP | REFP | REFP | REFP | VCM | VCM |
| 01111110000000 | REFP | REFP | REFP | REFP | REFP | REFP | VCM |
| 11111110000000 | REFP | REFP | REFP | REFP | REFP | REFP | REFP |

The bottom plates of the seven 256 fF capacitors in the first sub-array of the second set of capacitors are coupled to REFP, VCM or REFN depending on the result of the first conversion by the 3.5-bit sub-A/D as described in Table 4.

TABLE 4

Bottom plate of first capacitor sub-array of the second set of capacitors after the first conversion

| Third Conversion Result at AD2 | CFN1 | CFN2 | CFN3 | CFN4 | CFN5 | CFN6 | CFN7 |
|---|---|---|---|---|---|---|---|
| 00000001111111 | REFP | REFP | REFP | REFP | REFP | REFP | REFP |
| 00000001111110 | REFP | REFP | REFP | REFP | REFP | REFP | VCM |
| 00000001111100 | REFP | REFP | REFP | REFP | REFP | VCM | VCM |
| 00000001111000 | REFP | REFP | REFP | REFP | VCM | VCM | VCM |
| 00000001110000 | REFP | REFP | REFP | VCM | VCM | VCM | VCM |
| 00000001100000 | REFP | REFP | VCM | VCM | VCM | VCM | VCM |
| 00000001000000 | REFP | VCM | VCM | VCM | VCM | VCM | VCM |
| 00000000000000 | VCM | VCM | VCM | VCM | VCM | VCM | VCM |
| 00000010000000 | REFN | VCM | VCM | VCM | VCM | VCM | VCM |
| 00000110000000 | REFN | REFN | VCM | VCM | VCM | VCM | VCM |
| 00001110000000 | REFN | REFN | REFN | VCM | VCM | VCM | VCM |
| 00011110000000 | REFN | REFN | REFN | REFN | VCM | VCM | VCM |
| 00111110000000 | REFN | REFN | REFN | REFN | REFN | VCM | VCM |
| 01111110000000 | REFN | REFN | REFN | REFN | REFN | REFN | VCM |
| 11111110000000 | REFN | REFN | REFN | REFN | REFN | REFN | REFN |

Second comparison switch matrices 604 and 610, controlled by signals CTL2P and CTL2B, respectively, each initially couple the bottom plates of three 64 fF capacitors of the first and second set of capacitors to VINP and VINM, respectively during a sampling stage and during the first conversion by 3.5-bit sub-A/D. During the second conversion by a 2.5-bit A/D, the bottom plates of the capacitors CSP1-CSP3 and CSN1-CSN3 are coupled to feedback voltages VFBP and VFBN, respectively. After the second conversion, the bottom plates of CSP1-CSP3 in the second sub-array are coupled to REFP, VCM or REFN depending on the result of the second conversion by 2.5 bit A/D 510 as described in Table 5. The bottom plates of CSN1-CSN3 in the second sub-array of the second set of capacitors are coupled to REFP, VCM or REFN depending on the second conversion result as described in Table 5.

TABLE 5

Bottom plate of second capacitor sub-arrays of the first and second set of capacitors after the second conversion.

| Second Conversion Result at AD2 | CSP1 | CSP2 | CSP3 | CSN1 | CSN2 | CSN3 |
|---|---|---|---|---|---|---|
| 000111 | REFN | REFN | REFN | REFP | REFP | REFP |
| 000110 | REFN | REFN | VCM | REFP | REFP | VCM |
| 000100 | REFN | VCM | VCM | REFP | VCM | VCM |
| 000000 | VCM | VCM | VCM | VCM | VCM | VCM |
| 001000 | REFP | VCM | VCM | REFN | VCM | VCM |
| 011000 | REFP | REFP | VCM | REFN | REFN | VCM |
| 111000 | REFP | REFP | REFP | REFN | REFN | REFN |

Third comparison switch matrices 602 and 608, controlled by signals CTL3P and CTL3B, respectively, each initially couple the bottom plates of capacitors CTP1-CTP7 and CTN1-CTN7 of the first and second set of capacitors to VINP and VINM, respectively, during the sampling stage and during the first conversion by 3.5-bit sub-A/D. During the second conversion by 2.5-bit A/D, the bottom plates of the capacitors CSP1-CSP3 and CSN1-CSN3 are coupled to feedback voltages VFBP and VFBN, respectively. In the third 3.5-bit conversion, capacitors CTP-CTP7 are coupled to the top plate node TOPP via a series 64 fF capacitor CS1. Likewise, capacitors CTN-CTN7 are coupled to the top plate node TOPN via a series 64 fF capacitor CS2. After the third conversion, the bottom plates of CTP1-CTP7 in the third sub-array are coupled to REFP, VCM or REFN depending on the result of the third conversion by 3.5 bit A/D, as described in Table 6.

TABLE 6

Bottom plate of third capacitor sub-array of the first set of capacitors after the third conversion.

| Third Conversion Result at AD2 | CTP1 | CTP2 | CTP3 | CTP4 | CTP5 | CTP6 | CTP7 |
|---|---|---|---|---|---|---|---|
| 00000001111111 | REFN | REFN | REFN | REFN | REFN | REFN | REFN |
| 00000001111110 | REFN | REFN | REFN | REFN | REFN | REFN | VCM |
| 00000001111100 | REFN | REFN | REFN | REFN | REFN | VCM | VCM |
| 00000001111000 | REFN | REFN | REFN | REFN | VCM | VCM | VCM |
| 00000001110000 | REFN | REFN | REFN | VCM | VCM | VCM | VCM |
| 00000001100000 | REFN | REFN | VCM | VCM | VCM | VCM | VCM |
| 00000001000000 | REFN | VCM | VCM | VCM | VCM | VCM | VCM |
| 00000000000000 | VCM | VCM | VCM | VCM | VCM | VCM | VCM |
| 00000010000000 | REFP | VCM | VCM | VCM | VCM | VCM | VCM |
| 00000110000000 | REFP | REFP | VCM | VCM | VCM | VCM | VCM |
| 00001110000000 | REFP | REFP | REFP | VCM | VCM | VCM | VCM |
| 00011110000000 | REFP | REFP | REFP | REFP | VCM | VCM | VCM |
| 00111110000000 | REFP | REFP | REFP | REFP | REFP | VCM | VCM |
| 01111110000000 | REFP | REFP | REFP | REFP | REFP | REFP | VCM |
| 11111110000000 | REFP | REFP | REFP | REFP | REFP | REFP | REFP |

The bottom plates of CTN1-CTN7 in the third sub-array of the second set of capacitors are coupled to either REFP, VCM, and REFN depending on the second conversion result as described in Table 7.

TABLE 7

Bottom plate of third capacitor sub-array of the second set of capacitors after the third conversion.

| Third Conversion Result at AD2 | CTN1 | CTN2 | CTN3 | CTN4 | CTN5 | CTN6 | CTN7 |
|---|---|---|---|---|---|---|---|
| 00000001111111 | REFP | REFP | REFP | REFP | REFP | REFP | REFP |
| 00000001111110 | REFP | REFP | REFP | REFP | REFP | REFP | VCM |
| 00000001111100 | REFP | REFP | REFP | REFP | REFP | VCM | VCM |
| 00000001111000 | REFP | REFP | REFP | REFP | VCM | VCM | VCM |

TABLE 7-continued

Bottom plate of third capacitor sub-array of the
second set of capacitors after the third conversion.

| Third Conversion Result at AD2 | CTN1 | CTN2 | CTN3 | CTN4 | CTN5 | CTN6 | CTN7 |
|---|---|---|---|---|---|---|---|
| 00000001110000 | REFP | REFP | REFP | VCM | VCM | VCM | VCM |
| 00000001100000 | REFP | REFP | VCM | VCM | VCM | VCM | VCM |
| 00000001000000 | REFP | VCM | VCM | VCM | VCM | VCM | VCM |
| 00000000000000 | VCM | VCM | VCM | VCM | VCM | VCM | VCM |
| 00000010000000 | REFN | VCM | VCM | VCM | VCM | VCM | VCM |
| 00000110000000 | REFN | REFN | VCM | VCM | VCM | VCM | VCM |
| 00001110000000 | REFN | REFN | REFN | VCM | VCM | VCM | VCM |
| 00011110000000 | REFN | REFN | REFN | REFN | VCM | VCM | VCM |
| 00111110000000 | REFN | REFN | REFN | REFN | REFN | VCM | VCM |
| 01111110000000 | REFN | REFN | REFN | REFN | REFN | REFN | VCM |
| 11111110000000 | REFN | REFN | REFN | REFN | REFN | REFN | REFN |

Capacitors CFN and CFP are each coupled to amplifier feedback signals VFBP and VFBN respectively. These capacitors provide a feedback path for amplifier 514 (FIG. 7) during the last conversion. In addition, seven parallel 64 fF capacitors CG1 are coupled to TOPP via series 64 fF capacitor CG2, and seven parallel 64 fF capacitors CG3 are coupled to TOPN via series 64 fF capacitor CG4. Capacitors CFN, CFP, CG1, CG2, CG3 and CG4 can be adjusted to optimize the dynamics of amplifier 514 and the accuracy of the A/D converter.

Each capacitance is constructed of unit capacitors that are nominally about 64 fF. For example, the 256 fF capacitors coupled to first comparison switch matrices 606 and 612 are each made of four parallel 64 fF capacitors. In alternative embodiments, different unit capacitor values can be used, and/or some or all of the capacitors can be configured in other ways besides using unit capacitors.

Figure 9:
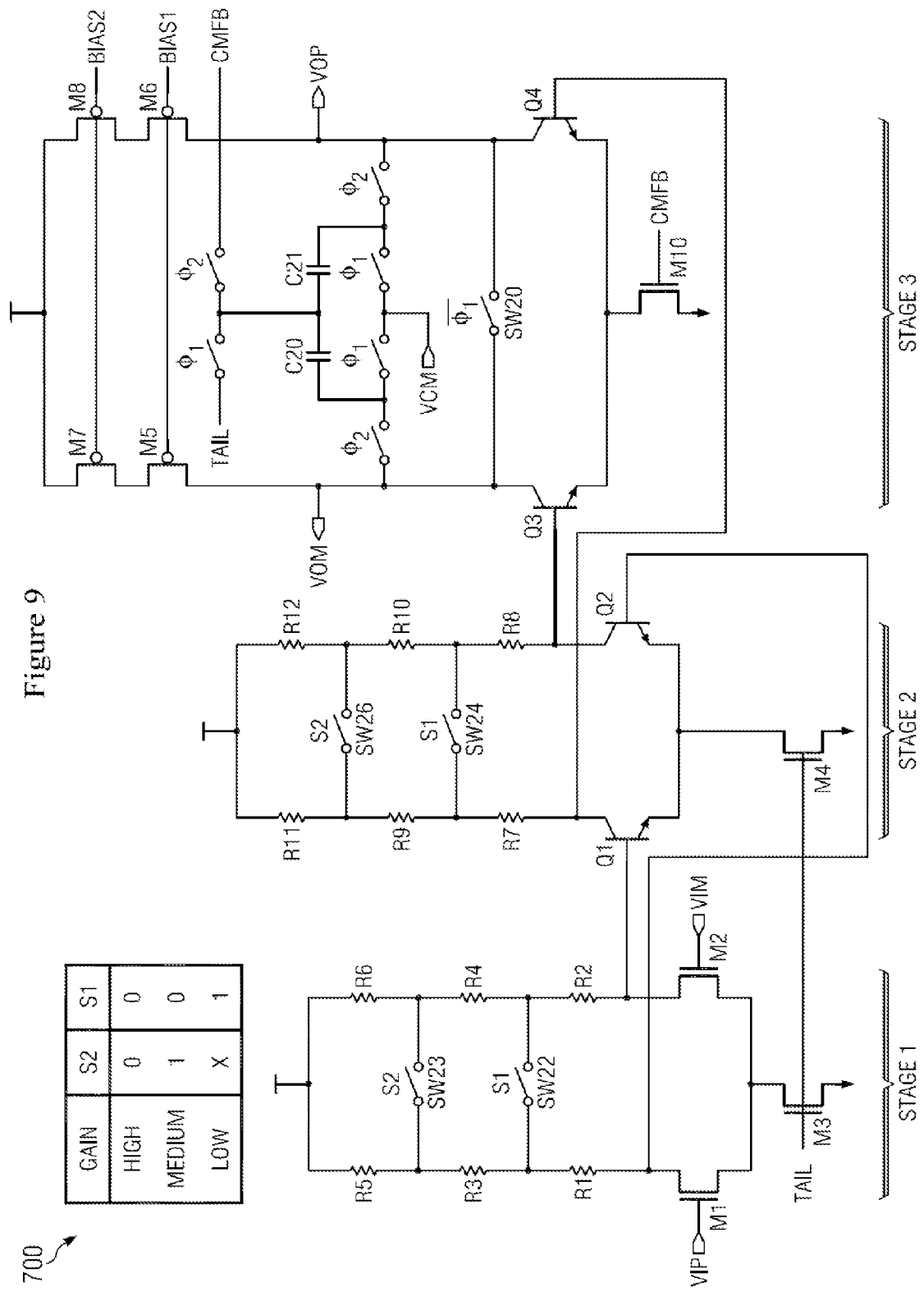
FIG. 9 illustrates a schematic of an embodiment operational transconductance amplifier.

FIG. 9 illustrates a schematic of three-stage operational transconductance amplifier (OTA) 700. In an embodiment, stage 1 of OTA 700 has a differential input pair of NMOS transistors M1 and M2 coupled to inputs VIP and VIM and to current source NMOS transistor M3. The drains of M1 and M2 are loaded by a programmable resistor load made of resistors R1-R6 controlled by gain control signals S1 and S2. The first stage of OTA 700 uses NMOS transistors M1 and M2 to prevent DC current from leaking from the capacitor array. Stage two, which is cascaded after stage 1, has a bipolar differential pair Q1 and Q2 coupled to current source transistors M4. The bipolar differential pair is loaded by programmable resistors load made of resistors R7-R12. Stage 3 is cascoded output stage with bipolar differential input Q3 and Q4 coupled to NMOS current source transistor M10 and loaded by a cascoded current source made of PMOS transistors M5-M8. In an embodiment, the cascoded current source is biased via BIAS1 and BIAS2 using high swing cascode bias techniques known in the art, however, other biasing techniques can be used. The output of OTA 700 is taken from VOM and VOP at the collectors of transistors Q3 and Q4 respectively.

In an embodiment, the common mode voltage of outputs VOM and VOP is controlled using switched capacitor common mode biasing. During a first phase φ1, the difference between the current source bias voltage TAIL for stage 1 and stage 2, and a desired common mode voltage VCM is stored across capacitors C20 and C21. During a second phase φ2, first ends of C20 and C21 are coupled to output voltages VOM and VOP respectively, and the second ends of C20 and C21 are coupled to node CMFB, which is coupled to the gate of current source transistor M10. When φ1 is not active, the output of stage 3 of OTA 700 is coupled together using SW20. During this phase, VOP and VOM are reset to VCM. In alternative embodiments, other common mode biasing techniques known in the art can be used.

The gain of amplifier 700 is controlled by gain control signals S1 and S2, which adjust the load resistance of stages 1 and 2. When S1 and S2 are not asserted (i.e., when switches SW22, SW23, SW24 and SW26 are all open), the gain of amplifier 700 is at its highest setting. When S2 is asserted and S1 is not asserted, the gain of amplifier 700 is at a medium setting, and when S1 as asserted, the gain of amplifier 700 is at its lowest setting.

In embodiments of the present invention, the gain of OTA 700 is adjusted according to which conversion cycle is active. Because the ratio of the capacitors coupled to the amplifier feedback to the capacitors coupled to a reference voltage within the capacitor array varies according to the conversion cycle, the closed-loop dynamics of OTA 700 are prone to change according to conversion cycle as well. For example, settling time of amplifier 700 depends on the closed-loop bandwidth of the system, that is t(tau)=1/(B*Wu), where B is the feedback factor and Wu is the unity gain bandwidth, if the feedback factor is lower, the system settles slower. Furthermore, if the unity gain bandwidth is too large at a high feedback factor, the closed-loop bandwidth is also high. Therefore, if a non-dominant pole is lower in frequency than closed loop bandwidth, the system is unstable. The unity gain bandwidth and the non-dominant pole of OTA 700 (along with the rest of the system) are both affected by the load resistance of the pre-amps:

$$Wu = gm1*RL*gm2*RL*gm3/C1, \text{ and}$$

$$Wp = 1/(RL*Cp),$$

where gm1, gm2 and gm3 are the transconductances of stage 1, 2 and 3, respectively, RL is the load resistance of stages 1 and 2, C1 is the load capacitance of OTA 700, Wp is the frequency of the non-dominant pole, and Cp is parasitic capacitance present at the output of the first stage. In one embodiment stage 3 determines the location of dominant pole.

When the feedback factor is lower, RL is increased to speed up settling; when the feedback factor is higher, RL is decreased. In an embodiment, RL is selected to make Wp a little higher than the closed-loop gain. A suitable RL selection makes Wp a little higher than closed loop gain:

$$1/(RL*Cp) > B*gm1*RL*gm2*RL*gm3/C1.$$

In an embodiment, gain selection signals S1 and S2 are programmed according to Table 8. In alternative embodiments, other gain values can be used.

TABLE 8

Gain Selection Signals According to Conversion Cycle.

| Step | S2 | S1 |
|---|---|---|
| Sampling | X | 1 |
| First Conversion | X | 1 |
| Second Conversion | 1 | 0 |
| Third Conversion | 1 | 0 |
| Fourth Conversion | 0 | 0 |

Figure 10:
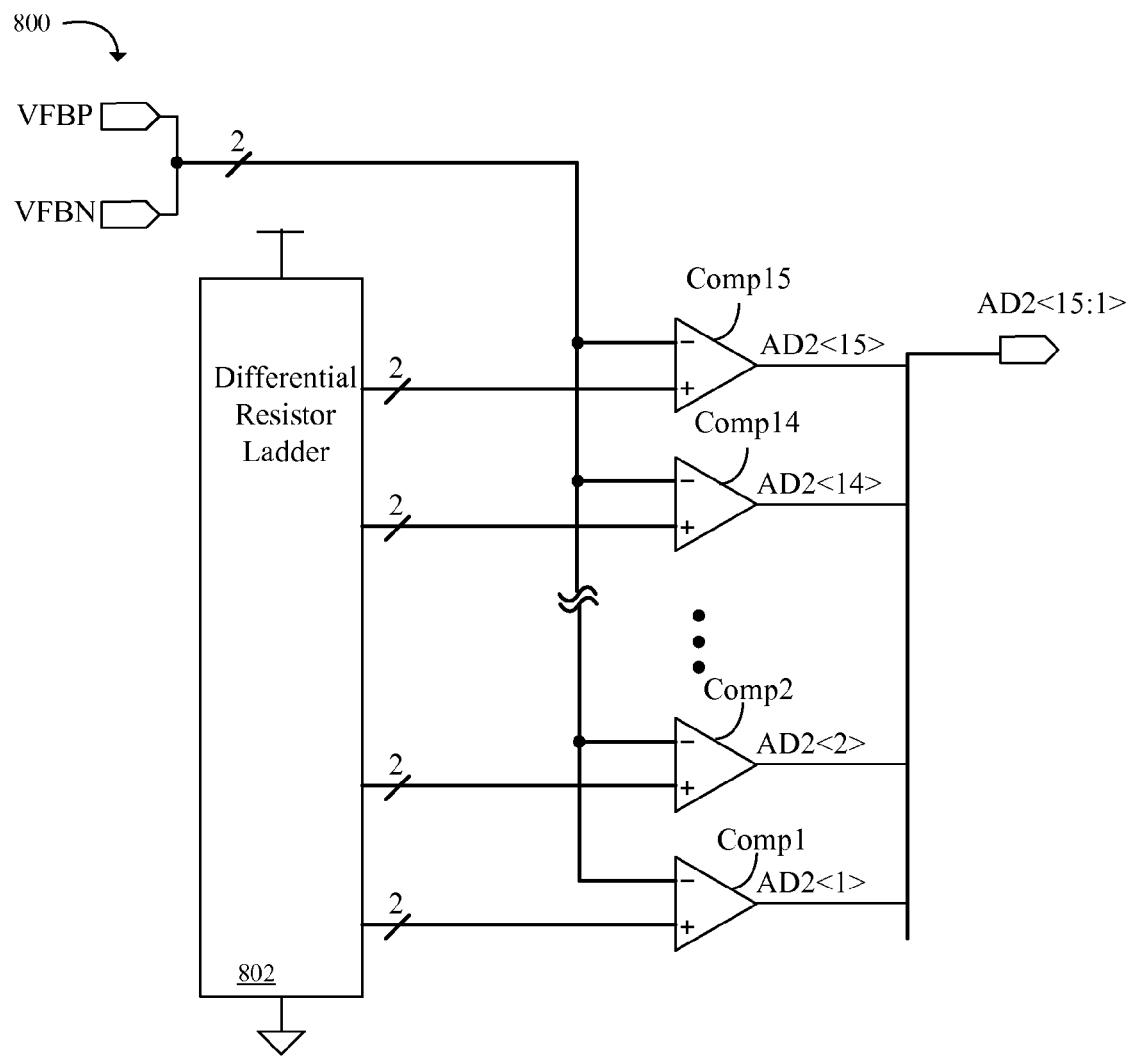
FIG. 10 illustrates a schematic of an embodiment 3.5/4 bit sub-A/D converter.

FIG. 10 illustrates a schematic of 3.5/4-bit A/D converter 800, which, in an embodiment, is implemented as a flash A/D having differential resistor ladder 802 and comparators Comp1-Comp15. Comparators Comp3-Comp13 are not shown for simplicity of illustration. Differential resistor ladder 802 is a tapped resistor string of resistors that outputs 16 differential reference voltages, and comparators Comp1-Comp15 are latched dynamic comparators implemented using techniques known in the art. When 3.5/4-bit A/D converter 800 is used in a 3.5-bit mode, only the outputs AD2<14:1> of comparators Comp1-Comp14 are used. When 3.5/4-bit A/D converter 800 is used in a 4-bit mode, outputs AD2<15:1> of comparators Comp1-Comp15 are used.

Figure 11:
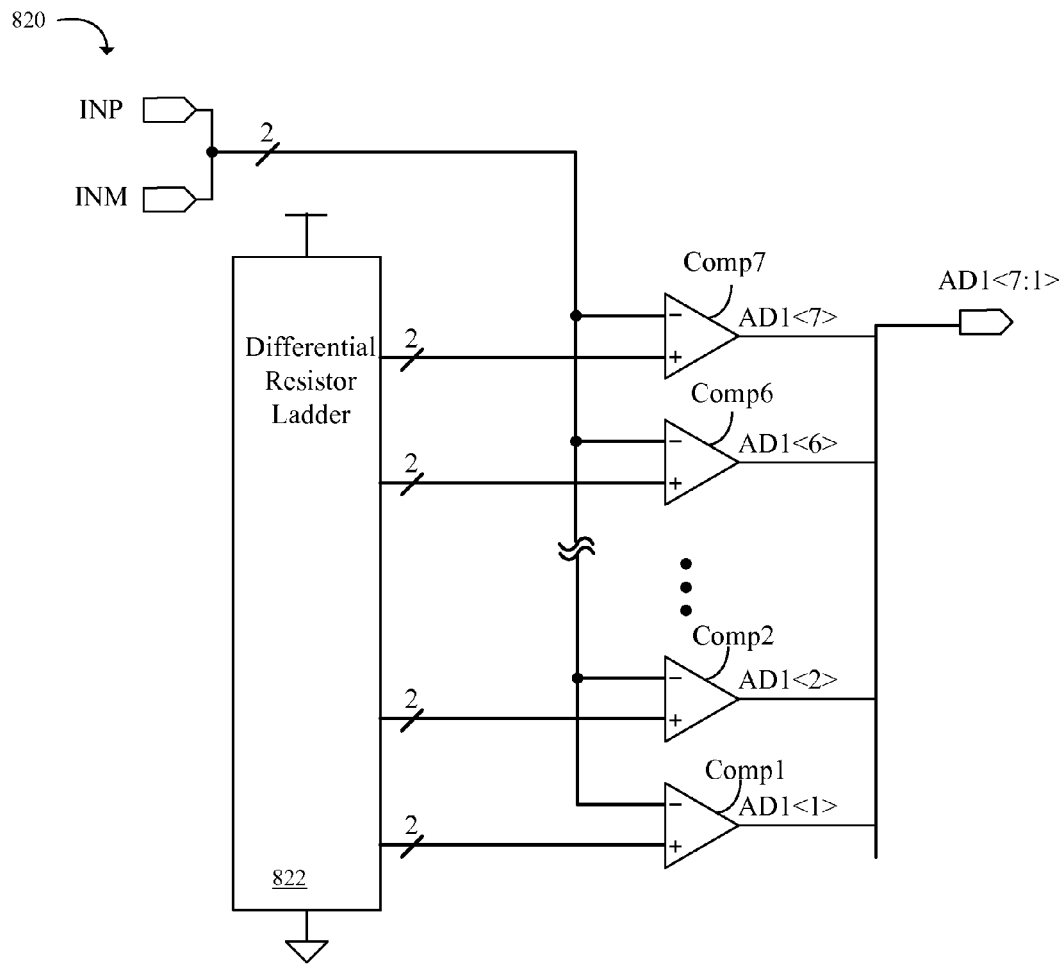
FIG. 11 illustrates a schematic of an embodiment 2.5 bit sub-A/D converter.

FIG. 11 illustrates a schematic of 2.5-bit A/D converter 820, which, in an embodiment, is implemented as a flash A/D having differential resistor ladder 822 and comparators Comp1-Comp6. Comparators Comp3 and Comp4 are not shown for simplicity of illustration. Differential resistor ladder 820 is a tapped resistor string of resistors that outputs 16 differential reference voltages, and comparators Comp1-Comp6 are latched dynamic comparators implemented using techniques known in the art. 2.5-bit A/D converter 820 outputs AD1<6:1> that indicate the state of the comparators after each conversion.

Figure 12:
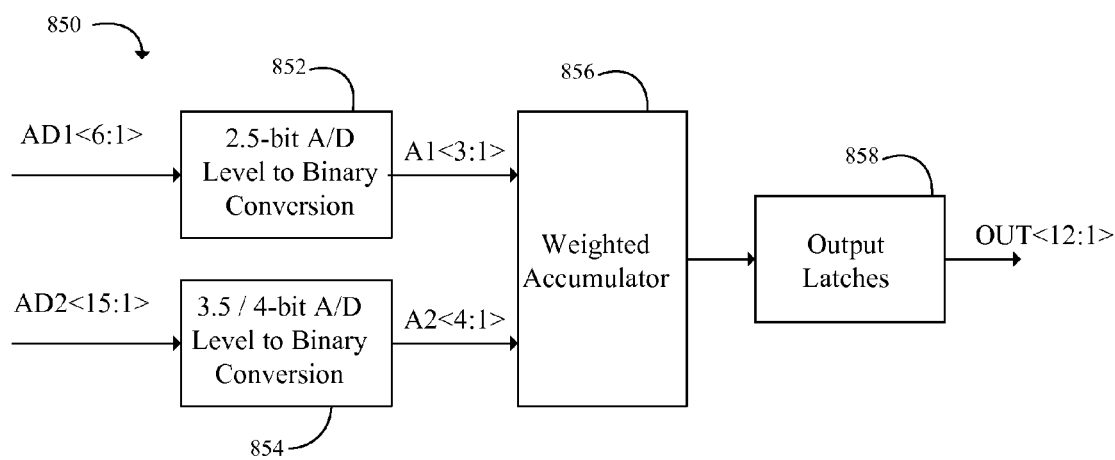
FIG. 12 illustrates a block diagram of an embodiment adder/latch block.

FIG. 12 shows a block diagram of an embodiment adder/latch block 850 that converts comparator state output AD1<6:1> from 2.5-bit A/D converter 502 (FIG. 7) and comparator state output AD1<16:1> from 3.5/4-bit A/D converter 510 (FIG. 7) to output data OUT<12:1>. Block 850 has conversion block 852 that converts comparator state data AD1<6:1> into binary data A1<3:1> and conversion block 854 that converts comparator state data AD1<15:1> into binary data A1<4:1> according to Tables 9 and 10. In alternative embodiments, other comparator to code mappings can be used.

TABLE 9

Conversion from Comparator State Data AD1<6:1> into Binary Data A1<3:1>.

| AD<6:1> | A1<3> | A1<2> | A1<1> |
|---|---|---|---|
| 000111 | 0 | 0 | 0 |
| 000110 | 0 | 0 | 1 |
| 000100 | 0 | 1 | 0 |
| 000000 | 0 | 1 | 1 |
| 001000 | 1 | 0 | 0 |
| 011000 | 1 | 0 | 1 |
| 111000 | 1 | 1 | 0 |

TABLE 10

Conversion from Comparator State Data AD1<6:1> into Binary Data A1<3:1>

| AD<15>* | AD<14:1> | A2<4> | A2<3> | A2<2> | A2<1> |
|---|---|---|---|---|---|
| 0 | 00000001111111 | 0 | 0 | 0 | 0 |
| 0 | 00000001111110 | 0 | 0 | 0 | 1 |
| 0 | 00000001111100 | 0 | 0 | 1 | 0 |
| 0 | 00000001111000 | 0 | 0 | 1 | 1 |
| 0 | 00000001110000 | 0 | 1 | 0 | 0 |
| 0 | 00000001100000 | 0 | 1 | 0 | 1 |
| 0 | 00000001000000 | 0 | 1 | 1 | 0 |
| 0 | 00000000000000 | 0 | 1 | 1 | 1 |
| 0 | 00000010000000 | 1 | 0 | 0 | 0 |
| 0 | 00000110000000 | 1 | 0 | 0 | 1 |
| 0 | 00001110000000 | 1 | 0 | 1 | 0 |
| 0 | 00011110000000 | 1 | 0 | 1 | 1 |
| 0 | 00111110000000 | 1 | 1 | 0 | 0 |
| 0 | 01111110000000 | 1 | 1 | 0 | 1 |
| 0 | 11111110000000 | 1 | 1 | 1 | 0 |
| 1* | 11111110000000 | 1 | 1 | 1 | 1 |

*Indicates 4-bit mode.

Weighted accumulator 856 weights and accumulates the results of each of the four conversion cycles. The final result is weighed according to the expression:

$$Y_{OUT} = 512 \cdot X_1 + 64 \cdot X_2 + 8 \cdot X_3 + X_4,$$

where $Y_{OUT}$ is the 12 bit final accumulated result, $X_1$ is the result of the first conversion (2.5 bits) via A1<3:1>, $X_2$ is the result of the second conversion (3.5 bits) via A2<4:1>, $X_3$ is the result of the third conversion (3.5 bits) via A2<4:1>, and $X_4$ is the result of the fourth conversion (4 bits) via A2<4:1>. In alternative embodiments, other weighting factors can be used. In an embodiment, weighted accumulator 856 has registers and performs the weighting function by shifting input data. Output latches 858 have registered logic to buffer 12-bit output word OUT<12:1>.

It will also be readily understood by those skilled in the art that materials and methods may be varied while remaining within the scope of the present invention. It is also appreciated that the present invention provides many applicable inventive concepts other than the specific contexts used to illustrate embodiments. Accordingly, the appended claims are intended to include within their scope such processes, machines, manufacture, compositions of matter, means, methods, or steps.

What is claimed is:

1. A circuit for performing an analog to digital (A/D) conversion, the circuit comprising:
an amplifier comprising an input and an output;
a capacitor array comprising capacitors each having a first end and a second end, wherein respective first ends of a plurality of the capacitors are each coupled to a selection circuit configured to individually couple the respective first end of each of the plurality of the capacitors to a system input voltage, the output of the amplifier, or one of a plurality of reference voltages, and
the second end of each of the plurality of the capacitors are coupled to the input of the amplifier;
an A/D converter coupled to the output of the amplifier;
a control unit configured to:
cause the circuit to sample the system input voltage by controlling the selection circuit to couple the first end of each capacitor in the capacitor array to the system input voltage in a sampling step,
after the sampling step, cause the A/D converter to perform a first A/D conversion in a first conversion step to produce a first conversion result,
after the first conversion step, cause the selection circuit to selectively couple respective first ends of each of a first group of the plurality of the capacitors to one of the plurality of reference voltages based on the first conversion result, and couple respective first ends of the plurality of the capacitors not in the first group to the output of the amplifier in a first redistribution step,
after the first redistribution step, cause the A/D converter to perform a second A/D conversion in a second conversion step to produce a second conversion result; and
an output circuit configured to perform a weighted sum of the first and second conversion result to produce a system output value.

2. The circuit of claim 1, wherein
the control unit is further configured to
after the second conversion step, cause the selection circuit to selectively couple respective first ends of each of a second group of the plurality of the capacitors to one of the plurality of reference voltages based on the second conversion result, and couple respective first ends of the plurality of the capacitors not in the first group or in the second group to the output of the amplifier in a second redistribution step, and
after the second redistribution step, cause the A/D converter to perform a third A/D conversion in a second conversion step to produce a third conversion result; and
the output circuit is further configured to perform a weighted sum of the first, second and third conversion results to produce a the system output value.

3. The circuit of claim 2, wherein the control unit is further configured to increase an open loop gain of the amplifier during the second redistribution step.

4. The circuit of claim 1, wherein the control unit is further configured to increase an open loop gain of the amplifier during the first redistribution step.

5. The circuit of claim 4, wherein the amplifier comprises a gain selection input coupled to an output of the control unit.

6. The circuit of claim 1, wherein the A/D converter comprises a plurality of comparators.

7. The circuit of claim 1, wherein
the capacitor array comprises a differential capacitor array;
the amplifier comprises a differential amplifier; and
the A/D converter comprises a plurality of differential comparators.

8. The circuit of claim 1, wherein the A/D converter comprises a 3.5 bit A/D converter.

9. The circuit of claim 8, wherein an output of the 3.5 bit A/D converter is quantized to 15 levels.

10. The circuit of claim 1, wherein the circuit is configured to perform a redundancy algorithm to correct conversion errors.

11. The circuit of claim 1, wherein the capacitor array comprises a binary weighted array.

12. A semiconductor circuit for performing an Analog to Digital (A/D) conversion, the circuit comprising:
an amplifier comprising an input, an output;
a capacitor array comprising capacitors each having a first end and a second end, wherein respective first ends of a plurality of the capacitors are each coupled to a selection circuit configured to individually couple the respective first ends of each of the plurality of the capacitors to a system input voltage, the output of the amplifier, or one of a plurality of reference voltages, and
the second end of each of the plurality of the capacitors are coupled to the input of the amplifier;
a first A/D converter coupled to the system input;
a second A/D converter coupled to the output of the amplifier;
a control unit configured to control the semiconductor circuit to:
perform a first A/D conversion using the first A/D converter to produce a first conversion result;
sample the system input voltage by controlling the selection circuit to couple the first end of each capacitor in the capacitor array to the system input voltage in a sampling step,
after the sampling step, selectively couple the respective first ends of each of a first group of the plurality of the capacitors to one of the plurality of reference voltages based on the first conversion result, and couple respective first ends of each of the plurality of the capacitors not in the first group to the output of the amplifier by controlling the selection circuit in a first redistribution step,
after the first redistribution step, perform a second A/D conversion by using the second A/D converter in a second conversion step to produce a second conversion result;
after the second conversion step, selectively couple respective first ends of each of a second group of the plurality of the capacitors to one of the plurality of reference voltages based on the second conversion result, and couple respective first ends of the plurality of the capacitors not in the first group or the second group to the output of the amplifier by controlling the selection circuit in a second redistribution step, and
after the second redistribution step, perform a third A/D conversion by using the second A/D converter in a third conversion step to produce a third conversion result; and
an output circuit configured to perform a weighted sum of the first, second and third conversion results to produce a system output value.

13. The semiconductor circuit of claim 12, wherein
the control unit is further configured to
after the third conversion step, selectively couple respective first ends of each of a third group of the plurality of the capacitors to one of the plurality of reference voltages based on the third conversion result, and couple respective first ends of the plurality of the capacitors not in the first, second or third groups to the output of the amplifier by controlling the selection circuit in a third redistribution step, and after the third redistribution step, perform a fourth A/D conversion by using the second A/D converter in a fourth conversion step to produce a fourth conversion result; and the output circuit is further configured to perform a weighted sum of the first, second, third and fourth conversion results to produce the system output value.

14. The semiconductor circuit of claim 13, wherein:
the amplifier further comprises a gain control input coupled to the control unit; and
the control unit is further configured to change an open loop gain of the amplifier in order to compensate for changes in feedback factors during the first and second redistribution steps.

15. The semiconductor circuit of claim 14, wherein the open loop gain of the amplifier is lower in the second redistribution step than in the first redistribution step.

16. The semiconductor circuit of claim 13, wherein:
the first conversion result is quantized to 7 levels;
the second conversion result is quantized to 15 levels;
the third conversion result of quantized to 15 levels;
the fourth conversion result is quantized to 16 levels; and
the output circuit is further configured to
assign a weight of 512 to the first conversion result,
assign a weight of 64 to the second conversion result,
assign a weight of 8 to the third conversion result,
assign a weight of 1 to the fourth conversion result.

17. A method for converting an analog input value to a digital output value, the method comprising performing a successive approximation, performing the successive approximation comprising:

quantizing the analog input value to a first quantized value, the first quantized value comprising one of at least three levels;

forming a first residue, forming the first residue comprising
converting the first quantized value to a first analog value using a digital to analog converter (DAC), and
subtracting the first analog value from the analog input value;

quantizing the first residue to form a second quantized value, the second quantized value comprising one of at least three levels;

forming a second residue, forming the second residue comprising
converting the second quantized value to a second analog value using the DAC, and
subtracting the second analog value from the first residue value;

quantizing the second residue to form a third quantized value, the third quantized value comprising one of at least three levels; and forming the digital output value, forming comprising converting the first, second and third quantized values into the digital output value.

18. The method of claim 17, further comprising amplifying the first residue by a first multiplication factor before quantizing the first residue using an amplifier.

19. The method of claim 18, further comprising amplifying the second residue by a second multiplication factor using the amplifier, amplifying the second residue further comprising increasing an open loop gain of the amplifier, wherein
the amplifier has a higher open loop gain during amplifying the second residue than during amplifier the first residue, and
wherein the DAC comprises a switched capacitor array.

20. The method of claim 17, wherein the DAC comprises a switched capacitor array.

21. The method of claim 17, further comprising:
forming a third residue, forming the third residue comprising
converting the third quantized value to a third analog value using the DAC, and
subtracting the third analog value from the second residue value; and
quantizing the third residue to form a fourth quantized value, the fourth quantized value comprising one of at least three levels, wherein forming the digital output value further comprises converting the fourth quantized value into the digital output value.

22. The method of claim 21, wherein:
quantizing the analog input value comprises quantizing the analog input value to 7 levels;
quantizing the first residue comprises quantizing the first residue to 15 levels;
quantizing the second residue comprises quantizing the second residue to 15 levels;
quantizing the third residue comprises quantizing the third residue to 16 levels; and
forming the digital output further comprises
assigning a weight of 512 each level in the first quantized value,
assigning a weight of 64 to the second quantized value,
assigning a weight of 8 to the third quantized value, and
assigning a weight of 1 to the fourth quantized value.

23. The method of claim 17, wherein forming the digital output value comprises using an error correction algorithm.

* * * * *

UNITED STATES PATENT AND TRADEMARK OFFICE
CERTIFICATE OF CORRECTION

| | |
|---|---|
| PATENT NO. | : 8,537,046 B2 |
| APPLICATION NO. | : 13/331611 |
| DATED | : September 17, 2013 |
| INVENTOR(S) | : Jian Hua Zhao et al. |

It is certified that error appears in the above-identified patent and that said Letters Patent is hereby corrected as shown below:

In the Claims

In Col. 17, line 54, claim 2, delete "a the system" and insert --the system--.

Signed and Sealed this
Fifth Day of November, 2013

Teresa Stanek Rea
*Deputy Director of the United States Patent and Trademark Office*